United States Patent
Shumaker et al.

(10) Patent No.: US 12,191,871 B2
(45) Date of Patent: Jan. 7, 2025

(54) METHODS AND DEVICES FOR TDC RESOLUTION IMPROVEMENT

(71) Applicant: Intel Corporation, Santa Clara, CA (US)

(72) Inventors: Evgeny Shumaker, Nesher (IL); Elan Banin, Raanana (IL); Ofir Degani, Haifa (IL); Gil Horovitz, Emek-Hefer (IL)

(73) Assignee: Intel Corporation, Santa Clara, CA (US)

(*) Notice: Subject to any disclaimer, the term of this patent is extended or adjusted under 35 U.S.C. 154(b) by 597 days.

(21) Appl. No.: 17/355,217

(22) Filed: Jun. 23, 2021

(65) Prior Publication Data

US 2022/0278690 A1    Sep. 1, 2022

Related U.S. Application Data

(60) Provisional application No. 63/154,884, filed on Mar. 1, 2021.

(51) Int. Cl.
| | |
|---|---|
| *H03L 7/24* | (2006.01) |
| *G04F 10/00* | (2006.01) |
| *H03L 7/085* | (2006.01) |
| *H03L 7/099* | (2006.01) |

(52) U.S. Cl.
CPC ............. *H03L 7/24* (2013.01); *G04F 10/005* (2013.01); *H03L 7/085* (2013.01); *H03L 7/0991* (2013.01); *H03L 2207/50* (2013.01)

(58) Field of Classification Search
CPC ..... H03L 7/085; H03L 2207/50; H03L 7/087; G04F 10/005
See application file for complete search history.

(56) References Cited

U.S. PATENT DOCUMENTS

| | | | | |
|---|---|---|---|---|
| 7,888,973 | B1* | 2/2011 | Rezzi | H03L 7/087 327/105 |
| 2014/0292552 | A1* | 10/2014 | Kim | G04F 10/005 341/156 |
| 2018/0351562 | A1* | 12/2018 | Yoo | H03L 7/089 |
| 2019/0058481 | A1* | 2/2019 | Gao | H03L 7/0992 |

* cited by examiner

*Primary Examiner* — Ryan Johnson
(74) *Attorney, Agent, or Firm* — VIERING, JENTSCHURA & PARTNER MBB

(57) ABSTRACT

A TDC circuit configured to receive a reference clock (REF) signal and a signal derived from a LO; generate a plurality of digital values indicative of a measured phase difference between the signal derived from the LO and the REF signal, wherein each of the plurality of digital values are determined from a unique set of a plurality of sets of TDC measurement component quantization levels; generate a combined series of quantization levels based on a combination of the plurality of sets of TDC measurement component quantization levels; and determine a combined digital value from the combined series of quantization levels and at least one of the plurality of digital values to generate an output of the TDC circuit. The combined series of quantization levels may be generated by summing simultaneously occurring levels of each of the plurality of sets of TDC measurement component quantization levels together.

11 Claims, 7 Drawing Sheets

100

METHODS AND DEVICES FOR TDC RESOLUTION IMPROVEMENT

CROSS-REFERENCE TO RELATED APPLICATIONS

This application claims priority to U.S. provisional application 63/154,884 filed on Mar. 1, 2021, the contents which are incorporated by reference in their entirety.

TECHNICAL FIELD

Various aspects relate generally to wireless communications and time to digital converter (TDC) processing.

BACKGROUND

Time to digital converters (TDCs) are used in digital phase-locked loops (DPLLs) to quantize the relative phase between a local oscillator (LO) output (generally, a high frequency signal) and a reference clock (REF) output (generally, a lower frequency signal compared to the LO output). This quantization is determined in the TDC by measuring a relative time distance between a signifying event, such as rising or falling edges in each of the respective signals.

Modern communication and data processing systems pose an ever-increasing demand on the spectral purity of LO signals, which in turn demands high-resolution phase-quantization abilities. To address such a demand, two approaches may be implemented to increase the resolution abilities of TDCs: an intensive approach which enables a single TDC to provide multiple TDC samples for a LO signal per REF cycle, and an extensive approach in which a plurality of TDCs are each configured to provide a TDC sample within the same REF cycle. The multiple TDC samples, which may be provided as digital values indicative of concurrent measurements of the phase difference between the LO signal and the REF signal, obtained in either approach may then be combined to increase the TDC resolution and decrease quantization noise. The extensive approach may often be the selected path to adhere to stringent specifications for a given specific process technology. Conventional methods combine the multiple TDC samples by averaging them and using this average for the TDC output. The present disclosure provides improved mechanisms and schemes of TDC sample combining that allow for a simpler and more robust design to provide higher accuracy phase quantization results while consuming less area and supply current.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various aspects of the disclosure are described with reference to the following drawings, in which.

DESCRIPTION

Figure 1:
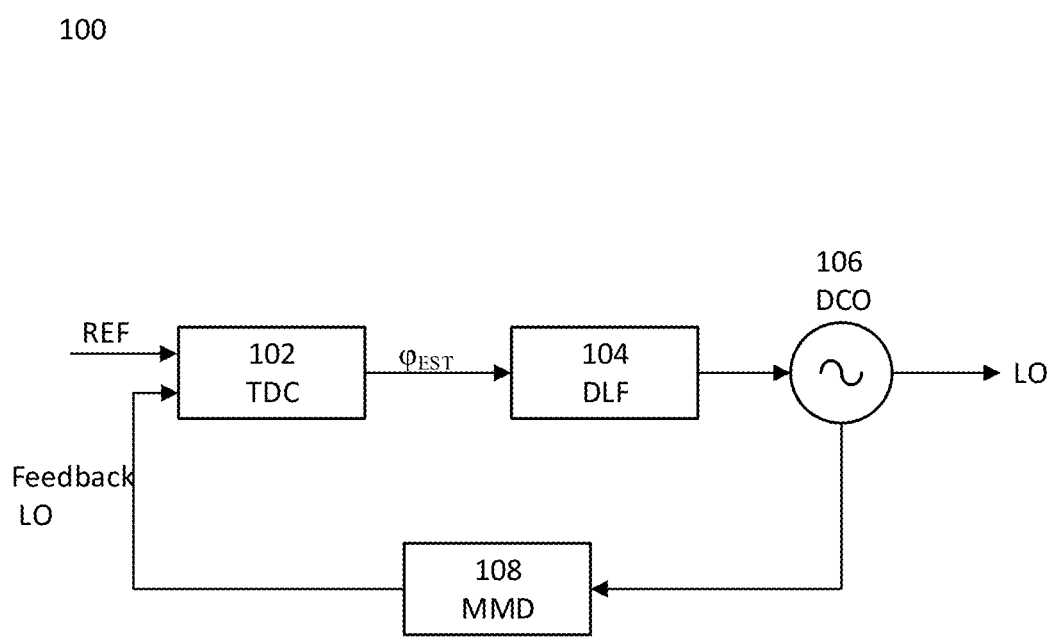
FIG. 1 exemplarily shows a DPLL circuit according to some aspects.

The methods and devices of the present disclosure provide mechanisms and schemes for TDC sample combining that allows for the improvement of quantization noise beyond the improvement of the traditional sample averaging by a factor of approximately two for a wide range of practical conditions. The TDC samples may be in the form of digital values obtained from concurrent measurements that are indicative of the phase difference between two signals, e.g., a phase difference between a signal derived from a LO and a REF signal.

The traditional realization of the extensive approach of resolution improvement calls for averaging among a plurality of concurrent, simultaneously available TDC samples. This is generally achieved by having multiple concurrent measurements (either via a single TDC or multiple TDCs) within a same sampling cycle. These TDC samples are provided in the form of digital values based on the comparison of two continuous waveforms. In this traditional approach, upon acquisition of the multiple TDC samples, the overall "combined" phase measurement is formed as an average of the TDC samples, compensating for any a-priori known (or calibrated) time skews between the TDC sampling instances. Under the assumption of statistic independence, averaging among N TDC samples reduces quantization error by a factor of $\sqrt{N}$ since the quantization error power scales with the number of samples averaged. This simple averaging of the samples method still falls short of the methods of the present disclosure by about $\sqrt{N}$, considering an equal chip area or amount of power.

The present disclosure creates a "super-state" (i.e., a virtual TDC) which provides information covering the quantization levels (i.e., the digital values) of all the concurrent TDC samples. In other words, the present disclosure is directed towards combining samples from multiple TDCs to obtain a more accurate measurement of the phase difference between two signals (e.g., a REF signal and a signal derived from a LO in a Phase Locked Loop circuit). This means that if at least one quantization level of one of the TDC samples is changed based on a detected a phase difference between the LO signal and the REF signal, a new virtual quantization level that is different from the previous one may be used. This effectively creates a virtual TDC whose quantization levels are intersections of the quantization levels of the involved TDC measurements. This virtual TDC (vTDC) provides an average quantization which scales inversely with the number of quantization level samples, N, leading to $\sqrt{N}$ improvement over simple averaging of the quantization level samples of the traditional approach.

The methods and devices of the present disclosure may be applied in any application requiring low phase noise LO generation (e.g., Wi-Fi, SerDes, radar, etc.) to improve the levels of phase characterization precision while lowering the potential cost with respect to chip area and power consumption.

The following detailed description refers to the accompanying drawings that show, by way of illustration, specific details and aspects in which the disclosure may be practiced.

The word "exemplary" is used herein to mean "serving as an example, instance, or illustration". Any aspect or design described herein as "exemplary" is not necessarily to be construed as preferred or advantageous over other aspects or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one. The terms "proper subset", "reduced subset", and "lesser subset" refer to a subset of a set that is not equal to the set, i.e. a subset of a set that contains less elements than the set.

Any vector and/or matrix notation utilized herein is exemplary in nature and is employed solely for purposes of explanation. Accordingly, aspects of this disclosure accompanied by vector and/or matrix notation are not limited to being implemented solely using vectors and/or matrices, and that the associated processes and computations may be equivalently performed with respect to sets, sequences, groups, etc., of data, observations, information, signals, samples, symbols, elements, etc.

The terms "processor" or "controller" or the like, for example, as used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit, and may also be referred to as a "processing circuit," "processing circuitry," among others. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality, among others, and conversely that any single processor, controller, or logic circuit detailed herein may be realized as two (or more) separate entities with equivalent functionality, among others.

As used herein, "memory" is understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory, and thus may refer to a collective component including one or more types of memory. Any single memory component may be separated into multiple collectively equivalent memory components, and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

The term "terminal device" utilized herein refers to user-side devices (both portable and fixed) that can connect to a core network and/or external data networks via a radio access network. "Terminal device" can include any mobile or immobile wireless communication device, including User Equipment (UE), Mobile Stations (MSs), Stations (STAs), cellular phones, tablets, laptops, personal computers, wearables, multimedia playback and other handheld or body-mounted electronic devices, consumer/home/office/commercial appliances, vehicles, and any other electronic device capable of user-side wireless communications. Without loss of generality, in some cases terminal devices can also include application-layer components, such as application processors or other general processing components that are directed to functionality other than wireless communications. Terminal devices can optionally support wired communications in addition to wireless communications. Furthermore, terminal devices can include vehicular communication devices that function as terminal devices.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. As used herein, a first radio communication technology may be different from a second radio communication technology if the first and second radio communication technologies are based on different communication standards.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). The term "communicate" may encompass one or both of transmitting and receiving, i.e., unidirectional or bidirectional communication in one or both of the incoming and outgoing directions. The term "calculate" may encompass both 'direct' calculations via a mathematical expression/formula/relationship and 'indirect' calculations via lookup or hash tables and other array indexing or searching operations.

FIG. 1 shows an exemplary digital phase locked loop (DPLL) circuit 100 according to some aspects. DPLL circuit 100 may be included in a local oscillator (LO) generation system of a signal processing component of a terminal device. It is appreciated that DPLL circuit 100 is exemplary in nature and may be simplified for purposes of this explanation.

DPLL circuit 100 may include a time to digital converter (TDC) circuit 102 that compares the phase of a reference clock (REF) signal with a feedback of the local oscillator (LO) signal generated by a digitally controlled oscillator (DCO) 106 of the DPLL circuit 100 and provides an estimated phase difference ($\varphi_{EST}$). TDC 102 may include multiple TDCs, where each TDC has set of TDC measurement component quantization levels for estimating the phase difference between the REF and the feedback LO. Each of the components of DPLL circuit 100 may include processors and/or processing elements for performing the functions recited herein.

The REF signal may, for example, be generated by a crystal oscillator or the like. The TDC circuit 102 output, i.e., the estimated phase difference ($\varphi_{EST}$), may include information to be provided to the DCO 106 that adjusts the DCO 106 in a manner that reduces the phase difference between the LO signal and the REF signal. A digital loop filter (DLF) 104 may be included between the TDC circuit 102 and the DCO 106 to filter the output of the TDC circuit to smooth the adjustments made to the DCO. DPLL circuit 100 may also include a multi modulus divider (MMD) 108 that divides the frequency of the LO signal by a varying divisor such that the average frequency of the feedback LO signal matches the frequency of the REF signal. The varying divisor may be received from other components of LO generation system.

The DCO 106 of DPLL circuit 100 generates the LO signal based on the DCO input, which may be based on a sequence of digital values generated by concurrent measurements of the TDC circuit 102. The digital values may be indicative of a detected phase difference between the REF signal and the feedback LO signal. For example, each digital value in the sequence of digital values may represent one of a plurality of concurrent measurements from each of the TDC measurement components of TDC 102 that represent a time interval between common events in the continuous waveforms of the REF signal and the feedback LO signal in a respective REF cycle. The common events may be, for example, the rising or falling edge of the respective signals. Each of these digital values may be referred to as a "quantization level value" and may be determined from a separate series of TDC quantization level values (illustratively shown as the quantization level grids in FIGS. 4-6). A TDC circuit with higher resolution may be described as having a higher number of quantization level values to select a digital value from and is therefore able to generate digital values that more accurately portray the actual phase difference between the continuous waveforms of the REF signal and the feedback LO signal.

Figure 4:
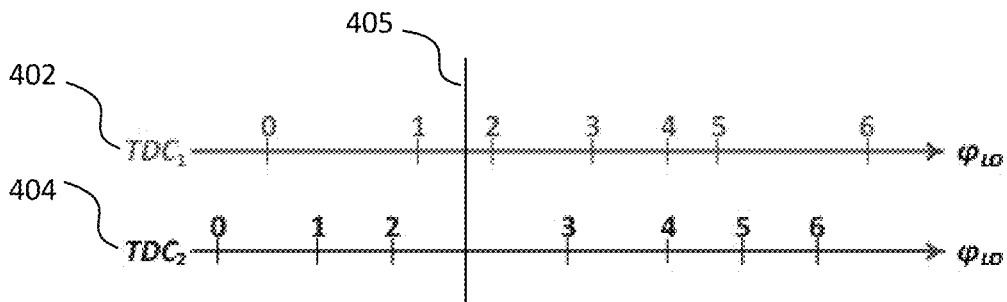
FIG. 4 exemplarily shows a quantization level diagram corresponding to FIGS. 2-3 according to some aspects.
Figure 5:
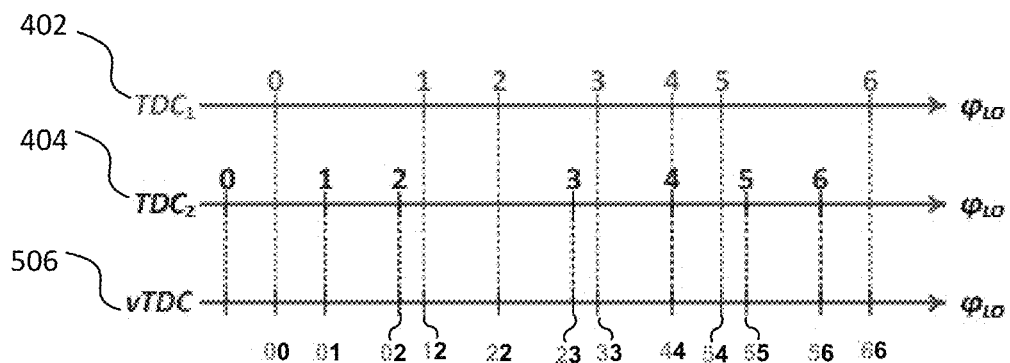
FIG. 5 exemplarily shows a quantization level diagram corresponding to FIGS. 2-3 with a newly created virtual TDC according to some aspects.
Figure 6:
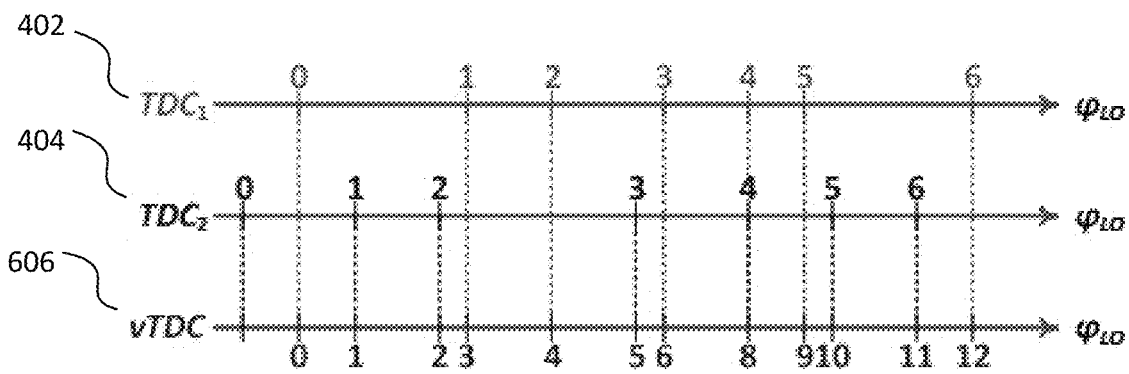
FIG. 6 exemplarily shows a quantization level diagram corresponding to FIGS. 2-3 with a newly created virtual TDC with a sum-based quantization level numeration according to some aspects.

In some aspects, each phase measurement component (i.e., TDC measurement component) of the TDC circuit 102 may include a plurality of buffer elements, where each of the plurality of buffer elements are coupled to a flip-flop gate that latches the value of its output based on the first input based on the delayed LO signal and a second input based on the REF signal. The plurality of flip-flop gates may be coupled to an encoder that is configured to generate a representation of the time interval elapsing between the two events in the inputs, e.g., between the rising (or falling) edge of a LO signal with the rising (or falling) edge of a REF signal, in the form of a digital (or quantization level) value. In some aspects, the digital output of the measurements of the TDC circuit may be representative of the relative location of the transition recorded by the flip-flop gates, e.g., a transition from "0" values to "1" values. The detectable locations of such a transition may be used to form the quantization level grid (as shown in FIGS. 4-6 and in FIG. 10) for each of the TDC measurement components in the TDC circuit.

In this manner, the TDC circuit may act as a phase detector configured to quantize the time interval between the two events, where the difference between the actual time interval and the quantized version of the time interval determined by the TDC circuit is known as the quantization error. The quantization error may be a function of the resolution of the TDC circuit, i.e., the higher the resolution of the TDC circuit, the lower the quantization error may be. Accordingly, TDCs operating at a higher resolution may provide finer granularity to more accurately quantize and therefore depict the time interval between common events of a LO signal and a REF signal.

To improve the resolution of the TDC circuit, different TDC phase quantization setups may be utilized to produce a plurality of digital values based on concurrent measurements of a time interval between a common event of the LO signal (or signal derived from the LO signal) and the REF signal. In this manner, instead of using a single digital value for determining the phase difference at a given instant, a plurality of digital values may be used. These two setups are shown in the TDC diagrams depicted in FIGS. 2 and 3. Although the description herein relates to combining two concurrent digital measurement values, it is appreciated that that the underlying principles may be scaled to higher numbers. Furthermore, it is appreciated that FIGS. 2 and 3 are exemplary in nature and may be simplified for purposes of this explanation.

Figure 2:
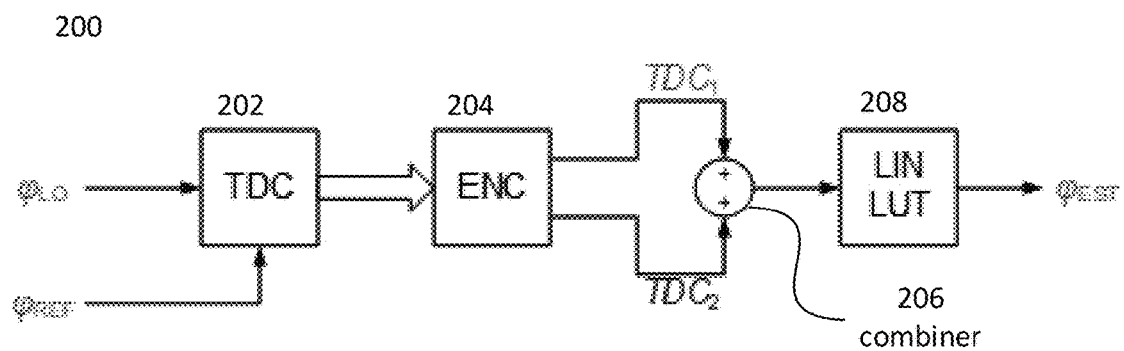
FIG. 2 exemplarily shows a single long TDC configuration according to some aspects.

In FIG. 2, an exemplary intensive approach is depicted by a single TDC measurement component 202 with sufficient dynamic range to provide a plurality of digital values (in this case, two) representative of concurrent phase difference measurements of the signal derived from the LO as compared to the REF signal. These digital values (denoted as TDC1 and TDC2) may be distilled out of the digital snapshot of the TDC with the help of an encoder (ENC) 204 and then may be further processed through a combiner 206 and a linearization algorithm that mitigates integral non-linearities, which may include a linearization look up table (LIN LUT) 208. The combiner 206 receives the digital values to generate an output including phase and/or frequency information related to the feedback LO and REF signals and provides this output to the LIN LUT 208 for estimating the phase difference. The non-linearities of the digital values of digital values TDC1 and TDC2 may be attributed to manufacturing mismatches that result in reduced control of the quantization level values detected by the TDCs with respect to one another. The TDC circuit 200, therefore, may produce an estimated phase difference ($\varphi_{EST}$) between the phase of the LO signal ($\varphi_{LO}$) and the phase of the REF signal ($\varphi_{REF}$).

Figure 3:
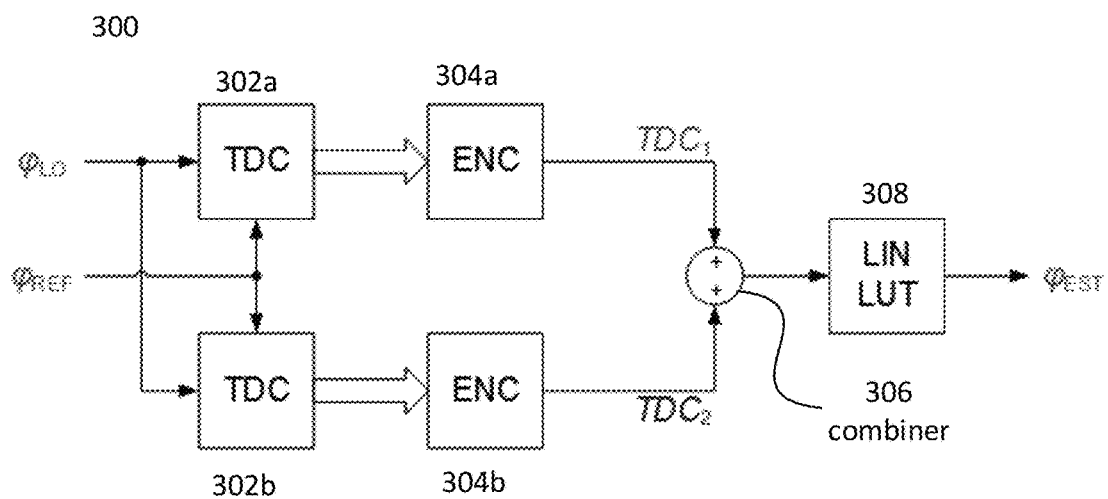
FIG. 3 exemplarily shows a multiple TDC configuration according to some aspects.

FIG. 3 illustrates an exemplary extensive approach in which a corresponding TDC circuit to the one shown in FIG. 2 is instantiated several times with multiple TDC measurement components 302a-302b and multiple encoders 304a-304b accompanied by a similar combiner 306 and LIN LUT 308 used in the single TDC setup of FIG. 2.

FIG. 4 shows an exemplary quantization level grid of the possible digital values for the concurrent measurements TDC1 and TDC2 described in FIGS. 2 and 3. Each quantization level grid for TDC1 402 and TDC2 404 is shown with its own set of quantization levels, i.e., each has a separate series of TDC quantization levels from which a digital value indicative of the estimated phase difference between two signals may be obtained. The quantization levels on the quantization level grids may indicate the instances corresponding to the detectable phase difference between the LO signal and the REF signal for the respective TDC measurement component in a TDC circuit. In other words, the quantization level values along the $\varphi_{LO}$ lines shown in FIG. 4 (and those shown in FIGS. 5 and 6) may each correspond to a detectable time interval for a common event in the LO and REF signals that may be measured in the concurrent TDC measurement components. If a detected phase difference between the two inputs (e.g., REF and feedback LO signals) to TDC1 and TDC2 falls on line 405, for example, TDC1 will provide a digital value corresponding to 1 and TDC2 will provide a digital value corresponding to 2.

As seen in FIG. 4, the separate series of TDC quantization levels (via the single, wide-range dynamic TDC measurement component setup shown in FIG. 2 or the multiple TDC measurement component setup shown in FIG. 3) for TDC1 and TDC2 may not be equal due to impurities and/or manufacturing limitations. This may result in the TDC measurement component quantization levels having different bin sizes, with some of those bins being comparatively large, such as the 0-1 and 5-6 bin in TDC1 and the 2-3 bin in TDC2. Accordingly, the quantization errors for these TDC quantization levels may be larger due to the increased spacing between the TDC quantization levels.

The present disclosure resolves these issues by introducing a new, virtual quantization level "super-state" termed a virtual TDC (vTDC). The quantization levels of the vTDC may also be described herein as being a combined series of TDC quantization levels based on a combination of the separate series of TDC quantization levels, i.e., based on each of the quantization grids of the TDC measurement components. For example, as shown in FIG. 5, the vTDC 506 may be based on a combination of the possible quantization levels for TDC1 and TDC2. In other words, the vTDC has a quantization level corresponding to each one of the quantization level boundaries of the individual TDCs (in this example, TDC1 or TDC2).

The vTDC 506 may have a range of LO phase values for all the possible combinations of the TDC quantization levels for TDC1 402 and TDC2 404. In some aspects, the vTDC may be generally described as an N-dimensional matrix for the different combinations of quantization levels for the N TDCs. In the explanation herein N=2, although it is appreciated that the concepts described herein are scalable to other numbers (e.g., N>2). In this example with TDC1 402 and TDC2 404, the matrix may be a two-dimensional matrix where the horizontal dimension may be TDC1 402 and the vertical dimension may be TDC2 404, for example. The entries along the main diagonal of such a matrix may mostly be representative of the possible combination of digital values that may be provided by the separate series of quantization levels of the TDCs.

In other words, each quantization level in the combined series of quantization levels (i.e., each quantization level of the vTDC) has a unique entry corresponding to each TDC quantization level of the separate series of TDC quantization levels. Put differently, vTDC 506 has a unique quantization level for every quantization level in the TDC measurement components for TDC1 and TDC2).

As depicted in FIG. 5, it is apparent that the number of possible quantization levels in the same $\varphi_{LO}$ range has nearly doubled in the vTDC 506. This means that, on average, the resolution of the quantization levels in the vTDC 506 is drastically improved over that of the TDC1 402 and TDC2 404, resulting in a ~6 dB decrease in the quantization noise. Furthermore, this is about 3 dB better than simply averaging the individual quantization level values of the two TDCs. The almost two-fold average improvement of resolution may be attributed to the improved equipartition of the $\varphi_{LO}$ range into the vTDC 506 quantization levels. The dominant phenomena contributing to improvement of the resolution is the reduction of the large quantization bins of the actual TDCs into several, and often much smaller, bins in the vTDC 506. For example, in the case of TDC1 bin 0-1, its range is partitioned into 3 separate bins in the vTDC: bin 00-01, bin 01-02, and bin 02-12.

Figure 9:
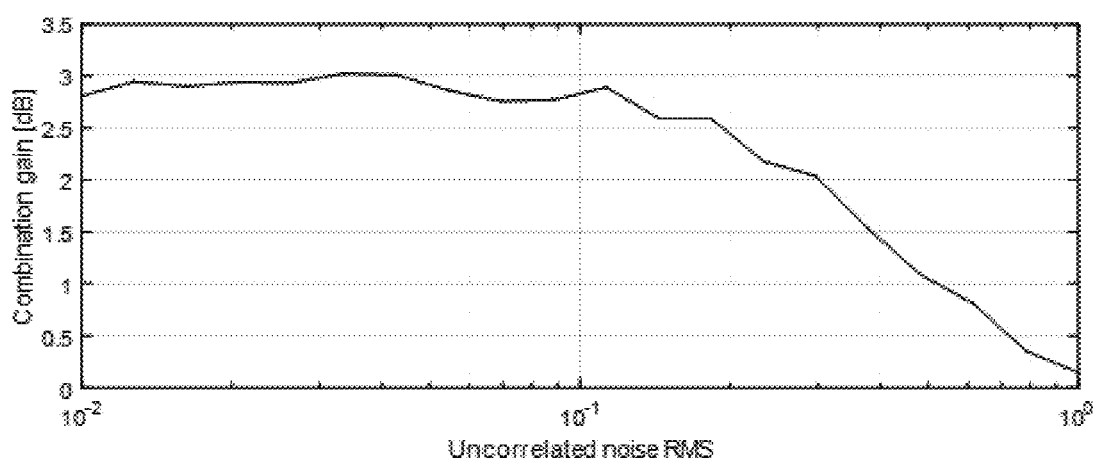
FIG. 9 exemplarily shows a graph of the combination gain versus uncorrelated noise root mean square (RMS) according to some aspects.

In some aspects, and shown in FIG. 6, the vTDC quantization level indices of FIG. 5 may be combined by summing them together to obtain a single index for each vTDC 606 quantization level for forwarding to the LIN LUT. This process allows for the use of substantially smaller linearization LUTs in the integral non-linear (INL) mitigation. The summing of the vTDC quantization index values from FIG. 5 to those shown in FIG. 6 has a one-to-one correspondence for the possible vTDC combinations. This general trait stems from the fact that $\varphi_{LO}$ phase as seen by the two TDC measurement components will not go in different directions, or differently put, the TDC measurement component quantization levels are monotonic with respect to one another. In other words, when the quantization level of one TDC measurement component, e.g., TDC1, changes to a higher quantization level, the quantization level of the other TDC measurement component, e.g., TDC2, will never go down. An exception to this trait may stem from the uncorrelated phase noise existing in the two TDCs (or accompanying the $\varphi_{LO}$ phase as seen by both TDCs). The effect of this uncorrelated noise on the combination gain is shown in FIG. 9. This means that a more effective and streamlined method of vTDC quantization level numeration may be implemented by the scheme shown in FIG. 6.

Figure 7:
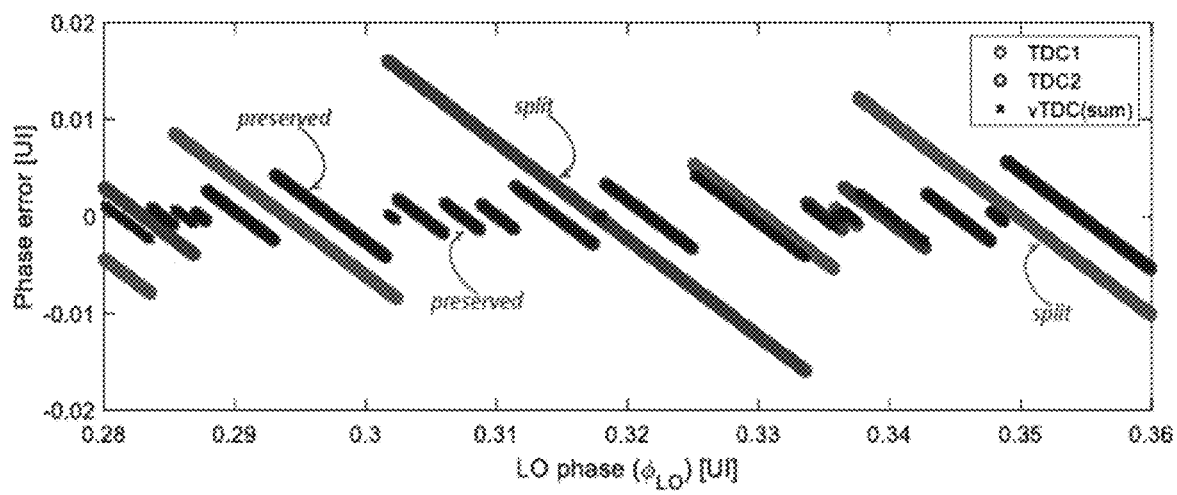
FIG. 7 exemplarily shows a graph of quantization error versus LO phase (yLo) according to some aspects.

FIG. 7 is an exemplary graph depicting the quantization error for different quantization levels in TDC1 and TDC2 as well as those of the virtual TDC (vTDC) with the sum method formation of the quantization levels discussed in FIG. 6. The y-axis shown the phase error measured in normalized unit intervals (UI) and the x-axis shows the LO phase (I w) also measured in normalized UIs.

Some of the quantization levels of the original TDC system of TDC1 and TDC2 are preserved by the vTDC. These preserved levels are shown by the overlapping of the vTDC with those of TDC1 and/or TDC2. In FIG. 7, two of these preserved levels are marked. The first of the marked preserved quantization levels (i.e., closest to the y-axis) corresponds with vTDC and TDC2, while the second of the marked preserved quantization levels corresponds with vTDC and TDC1. However, by implementing the methods of the present disclosure, some of the quantization levels of the original TDC system are split and are replaced with vTDC quantization levels having significantly smaller quantization errors. For example, several of the larger quantization levels (corresponding with the larger bins of TDC1 and TDC2) are replaced by vTDC quantization levels with quantization errors that are mostly centered around a phase error of zero. Again, this reduced phase error of the vTDC quantization levels may be attributed to the finer granularity of the bin-size, i.e., since the bins are smaller, the vTDC has a higher resolution to portray the actual phase difference between the LO and REF signals more accurately.

Figure 8:
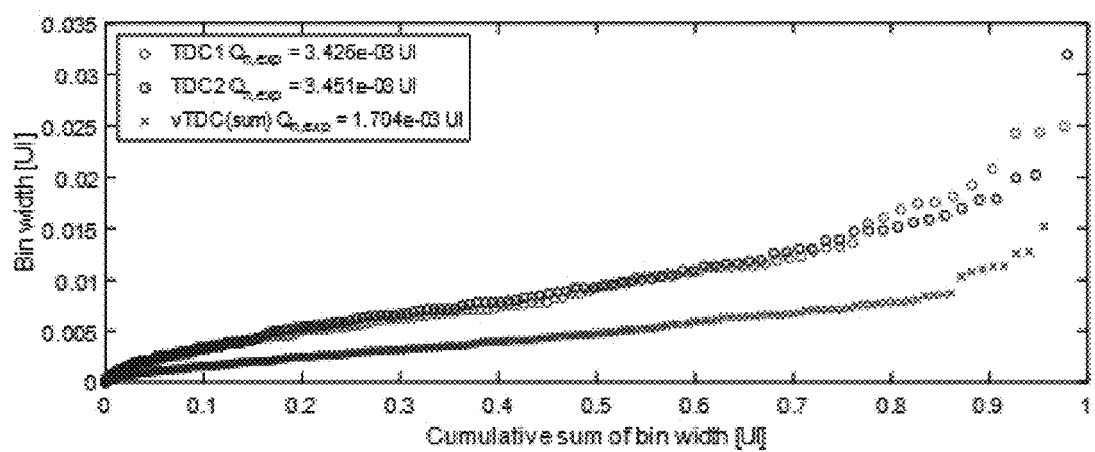
FIG. 8 exemplarily shows a graph of the quantization level bin widths versus the cumulative sum of the quantization level bin widths according to some aspects.

FIG. 8 is an exemplary graph illustrating the quantization bin vs. cumulative sum of sorted bin width. The bin width of the quantization levels is shown on the y-axis (measured in UIs) and the cumulative sum of the bin width of the quantization levels is shown on the x-axis (measured in UIs). Smaller sized bins appear at the beginning of the graph closer to the origin with larger sized bins appearing as the distance from the origin increases.

The curves are drawn for the quantization levels for TDC1 and TDC2 as well as corresponding vTDC. As shown in FIG. 8, the larger sized bins are almost eliminated in the vTDC. Considering the expected root mean square (RMS) quantization noise, the vTDC halves that of the original TDCs (about 1.7 UI for vTDC vs. about 3.42 UI for each of TDC1 and TDC2) whereas a simple averaging of the quantization results would have yielded quantization noise of roughly 2.43 UI, or approximately a full 3 dB above that of the vTDC.

In some aspects, the eventual combination gain (i.e., the improvement over regular averaging) may be dependent to some extent on the TDC quantization level spread, as well as the amount of uncorrelated noise seen by each individual TDC. To study that phenomenon, a large number of Monte-Carlo tests were conducted over various TDC designs with swept uncorrelated noise level. The results of those tests are summarized in FIG. 9, where the y-axis is the combination gain (in dBs) and the x-axis is the uncorrelated noise RMS normalized to the average quantization level bin.

FIG. 9 illustrates that beneath a certain level of noise (approximately 1/10 of the average quantization bin width), the combination gain levels off. At considerably higher noises than this level, the advantages of the vTDC techniques of the present disclosure may diminish due to the growing number of quantization errors introduced by the "super-state" formation of the vTDC which can no longer be considered monotonic. However, for the most part, the vTDC techniques of the present disclosure are still able to provide noticeable amounts of combination gain.

Figure 10:
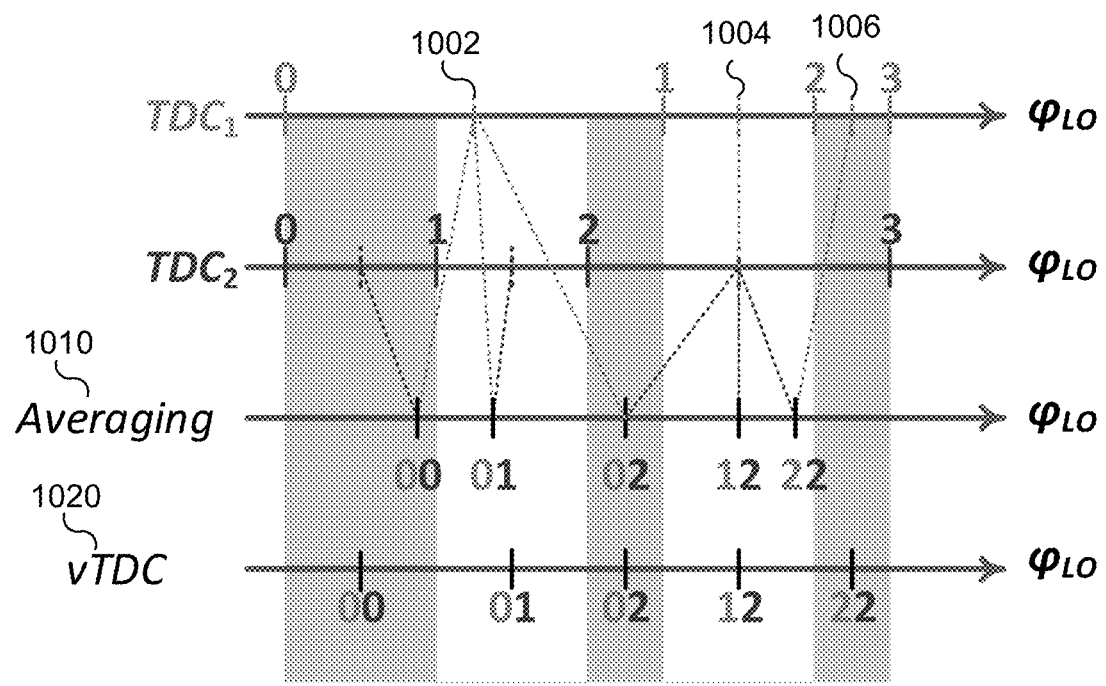
FIG. 10 exemplarily shows a quantization level diagram illustrating differences between an averaging method and the virtual TDC according to some aspects.

FIG. 10 shows quantization level grids that illustratively compare the conventional averaging method to the vTDC method for two TDCs according to some aspects. Although the explanation covers the case of two TDCs, it is appreciated this quantity be scalable to higher numbers.

In the quantization level grid for each of the individual TDCs (i.e., for TDC1 and TDC2), the small dashed vertical lines along the quantization level grid line represent the center of each quantization bin as it would be reported to the processing algorithm. For example, for TDC1, the bold dashed vertical line 1002 at the center of the 0-1 bin represents the value to be reported to the processing algorithm if the quantized value falls in the 0-1 in for TDC1, the bold dashed vertical line 1004 at the center of the 1-2 bin represents the value to be reported to the processing algorithm if the quantized value falls in the 1-2 bin for TDC1, and the bold dashed vertical line 1006 at the center of the 2-3 bin represents the value to be reported to the processing algorithm if the quantized value falls in the 2-3 in for TDC1. Similar markings are provided for TDC2.

The averaging method 1010 places its average levels of reporting exactly in the middle point between the individual reported quantities. The dashed diagonal lines illustrate the two results being combined to create the reporting quantity according to the averaging method 1010. As can be seen, in the averaging method 1010, if one of the TDCs has a particularly large bin, the TDC can skew the reported quantization level so as to negatively impact the accuracy of the reported detected phase difference. For example, TDC1 has a particularly large 0-1 bin, and will negatively impact the reported phase difference reported in conjunction with the much smaller 0-1 bin of TDC2. Therefore, in the averaging method, if the reported phase difference falls somewhere in each of the 0-1 bins for TDC1 and TDC2, the more accurate measurement provided by the higher granularity of the 0-1 bin of TDC1 will be lessened due to the impact of measurement provided by the 0-1 bin of TDC2.

However, in the virtual TDC (vTDC) method according to some aspects, the reported information stems from each individual TDC. Therefore, overall, the reported phase is kept at its original place, i.e., the center of the smallest among the intersected bins of TDC1 and TDC2. The vTDC method relies on the smaller bin to improve the quantization. By utilizing the intersection of the bin boundaries of each of the individual TDCs and placing the vTDC quantization levels at the midpoint of each of these intersected bin boundaries, the vTDC method 1020 provides higher resolution and greater accuracy for the detected phases.

The bins of the vTDC are created based on the boundaries of each of the bins of the individual TDCs. In other words, the bin boundaries of the vTDC are established at every instance one of the bins of the individual TDCs changes, i.e., for every transition in any one of the quantization levels of the individual TDCs (i.e., TDC1 or TDC2) and the corresponding reported phase is kept at the center of the established vTDC boundaries. For example, the first bin of the vTDC is created based on the 0-1 bin of TDC2, and the corresponding quantization level is placed at the midpoint of the bin (shown as 00 in the vTDC quantization level grid). The second bin of the vTDC is created based on the 0-1 bin of TDC2 since the next bin boundary also correspond to TDC2 and the corresponding quantization level is placed at the midpoint (shown as 01 in the vTDC quantization level grid). The third bin is created based on the boundaries of quantization level 2 of TDC2 and quantization level 1 of TDC1 and the corresponding quantization level is denoted as 02 in the vTDC quantization level grid. The quantization level values shown in the quantization level grid for vTDC 1020 are therefore utilized for reporting to the LUT for determining the estimated phase difference between the REF and the signal derived from the LO.

The shaded and white rectangles in the background of FIG. 10 denote the input phase. For example, in the first rectangle from the left (which overlaps the first bin of the TDC2), the reported quantity of the VTDC falls right in the center of the bin, thereby providing the best phase estimation of the phase given that the location is the 0-1 bin for TDC2. For all the input phases, the averaging method 1010 will report a location which is almost at the end of the input phase range. This is a far worse estimation of the input phase overall. Of course, there may be some exceptions if the input phase is indeed towards the end of the range, but in most cases (e.g., phase at the beginning or in the middle of the bin) the phase error in the averaging method 1010 will be much larger on average than the phase estimation provided by the vTDC 1020.

As shown in FIG. 10, there may be several instances in which the corresponding entries provided by the averaging method 1010 and the vTDC method 1020 are similar (e.g., at the 02 and 12 entries in each). However, vTDC entries 00, 01, and 22 provide for greater accuracy compared to the averaging method entries for the input phases.

Figure 11:
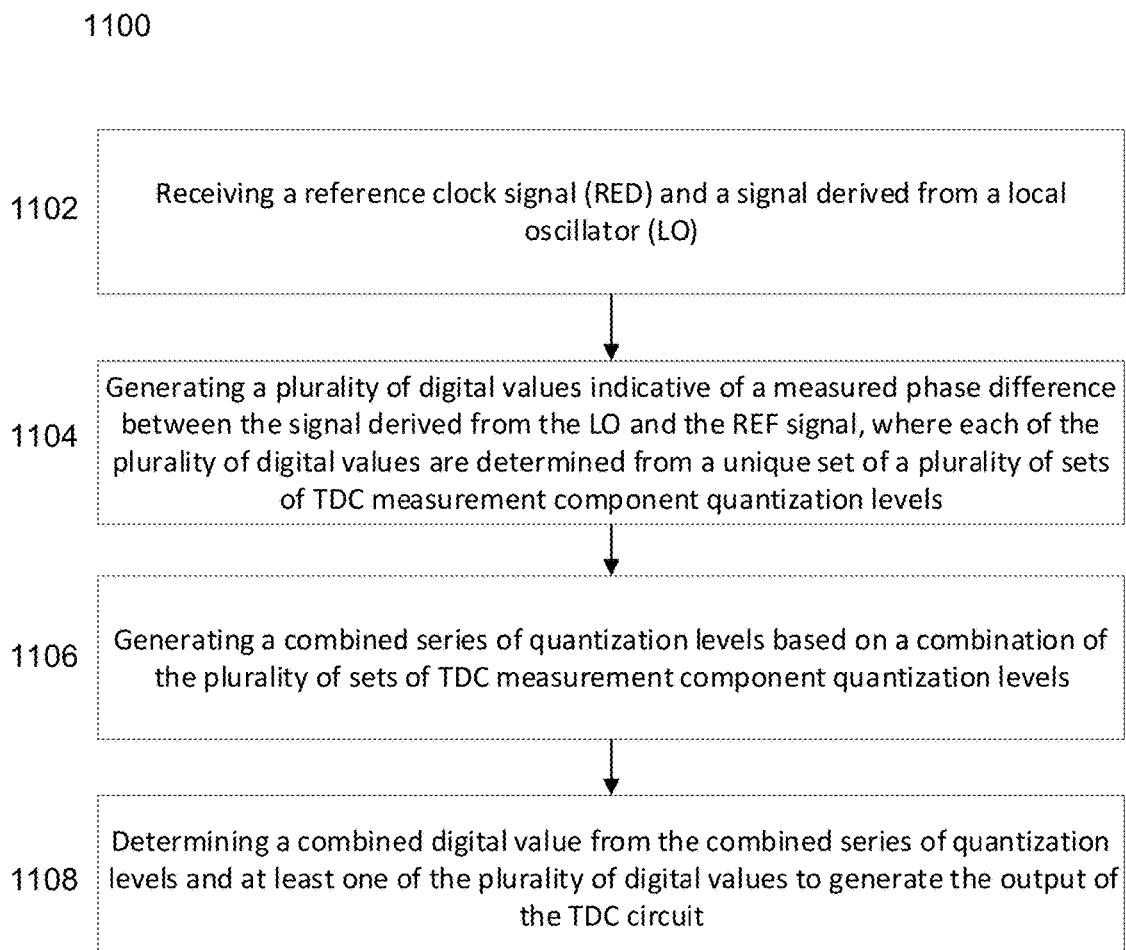
FIG. 11 exemplarily shows a flowchart describing a process for TDC sample combining according to some aspects.

FIG. 11 shows a flowchart 1100 describing a method for TDC sample combining according to some aspects. It is appreciated that flowchart 1100 is exemplary in nature and may thus be simplified for purposes of this explanation. Furthermore, it is appreciated that flowchart 1100 may be combined with other features discussed in the present disclosure.

The method may include receiving a reference clock (REF) signal and a signal derived from a local oscillator (LO) 1102; generating a plurality of digital values indicative of a measured phase difference between the signal derived from the LO and the REF signal, where each of the plurality of digital values are determined from a unique set of a plurality of sets of TDC measurement component quantization levels 1104; generating a combined series of quantization levels based on a combination of the plurality of sets of TDC measurement component quantization levels 1106; and determining a combined digital value from the combined series of quantization levels and at least one of the plurality of digital values to generate the output of the TDC circuit 1108. In this method, the plurality of digital values indicated of a measured phase difference in 1102 may correspond to the TDC samples from each of the individual TDC measurement components (e.g., TDC1 and TDC2 as discussed herein). The unique set of a plurality of sets of TDC measurement component quantization levels may correspond to the quantization level grids of each of the TDC measurement components (e.g., with respect to TDC1 and TDC2, shown as quantization level grid 402 and 404, respectively). The combined series of quantization levels may correspond to the quantization level grid of the vTDC shown in FIGS. 5-6 and 10 which is generated based on the boundaries of the quantization levels grids of TDC1 and TDC2, for example. The combined digital value may correspond to one of the entries of the vTDC quantization level grid that is used to generate the estimated phase difference output of the TDC circuit and may serve to provide the estimated phase difference ($\varphi_{EST}$) of the TDC circuit.

In this disclosure, the term "a plurality of TDC measurement components" refers to the plurality of TDCs, e.g., TDC1 and TDC2 of the figures. The term "a series of quantization levels" refers to the quantization level grid of each of the individual TDCs. The term "a combined series of quantization levels" refers to the quantization levels of the vTDC quantization level grid. Each quantization level of the vTDC corresponds to a digital value that is reported to the LUT to utilize to estimate the phase difference for reporting to the DLF of the DPLL circuit.

At least one of the components set forth in one or more of the preceding figures may be configured to perform one or more operations, techniques, processes, and/or methods as set forth in the example section below. For example, the TDC circuit as described above in connection with one or more of the preceding figures may be configured to operate in accordance with one or more of the examples set forth below.

Example 1 is a time to digital converter (TDC) circuit configured to: receive a reference clock (REF) signal and a signal derived from a local oscillator (LO); generate a plurality of digital values indicative of a measured phase difference between the signal derived from the LO and the REF signal, where each of the plurality of digital values are determined by one of a plurality of sets of TDC measurement component quantization levels; generate a combined series of quantization levels based on a combination of the plurality of sets of TDC measurement component quantization levels; and determine a combined digital value from the combined series of quantization levels and at least one of the plurality of digital values to generate an output of the TDC circuit.

In Example 2, the subject matter of Example(s) 1 may include a single TDC measurement component configured to generate the plurality of digital values.

In Example 3, the subject matter of Example(s) 1 may include a plurality of TDC measurement components, each TDC measurement component of the plurality of TDC measurement components configured to generate one of the plurality of digital values.

In Example 4, the subject matter of Example(s) 1 may include that each of the plurality of digital values are based on a time interval between a common event in the signal derived from the LO and the REF signal.

In Example 5, the subject matter of Example(s) 4 may include that the common event is a rising edge in the signal derived from the LO and the REF signal or a falling edge in the signal derived from the LO and the REF signal.

In Example 6, the subject matter of Example(s) 1 may include that each set of the plurality of sets of TDC measurement component quantization levels has a distinct TDC measurement component quantization level grid.

In Example 7, the subject matter of Example(s) 1 may include that each quantization level in the combined series of quantization levels has a unique entry corresponding to a TDC measurement component quantization level of the plurality of sets of TDC measurement component quantization levels.

In Example 8, the subject matter of Example(s) 1 may include that the combined series of quantization levels is generated by summing simultaneously occurring levels of each of the plurality of sets of TDC measurement component quantization levels together.

Example 9 is a time to digital converter (TDC) circuit configured to: receive a reference clock (REF) signal and a signal derived from a local oscillator (LO); generate a plurality of digital values indicative of a phase difference between the signal derived from the LO and the REF signal within a single REF cycle, where each of the plurality of digital values are determined from a separate series of TDC quantization levels; generate a combined series of quantization levels based on a combination of the separate series of TDC quantization levels; and determine a combined digital value from the combined series of TDC quantization levels and at least one of the plurality of digital values to generate an output of the TDC circuit.

In Example 10, the subject matter of Example(s) 9 may include a single TDC measurement component configured to generate the plurality of digital values.

In Example 11, the subject matter of Example(s) 9 may include a plurality of TDC measurement components, each TDC measurement component of the plurality of TDC measurement components configured to generate one of the plurality of digital values.

In Example 12, the subject matter of Example(s) 9 may include that each of the plurality of digital values are based on a time interval between a common event in the signal derived from the LO and the REF signal.

In Example 13, the subject matter of Example(s) 12 may include that the common event is a rising edge in the signal derived from the LO and the REF signal or a falling edge in the signal derived from the LO and the REF signal.

In Example 14, the subject matter of Example(s) 9 may include that each set of the plurality of sets of TDC measurement component quantization levels has a distinct TDC measurement component quantization level grid.

In Example 15, the subject matter of Example(s) 9 may include that each quantization level in the combined series of quantization levels has a unique entry corresponding to a TDC measurement component quantization level of the plurality of sets of TDC measurement component quantization levels.

In Example 16, the subject matter of Example(s) 9 may include that the combined series of quantization levels is generated by summing simultaneously occurring levels of each of the plurality of sets of TDC measurement component quantization levels together.

Example 17 is a method for a time to digital converter (TDC) circuit to produce an output, the method including: receiving a reference clock (REF) signal and a signal derived from a local oscillator (LO); generating a plurality of digital values indicative of a measured phase difference between the signal derived from the LO and the REF signal, where each of the plurality of digital values are determined from a unique set of a plurality of sets of TDC measurement component quantization levels; generating a combined series of quantization levels based on a combination of the plurality of sets of TDC measurement component quantization levels; and determining a combined digital value from the combined series of quantization levels and at least one of the plurality of digital values to generate the output of the TDC circuit.

In Example 18, the subject matter of Example(s) 17 may include generating the plurality of digital values with a single TDC measurement component.

In Example 19, the subject matter of Example(s) 17 may include generating the plurality of digital values with a plurality of TDC measurement components.

In Example 20, the subject matter of Example(s) 17 may include that each of the plurality of digital values are based on a time interval between a common event in the signal derived from the LO and the REF signal.

In Example 21, the subject matter of Example(s) 20 may include that the common event is a rising edge in the signal derived from the LO and the REF signal or a falling edge in the signal derived from the LO and the REF signal.

In Example 22, the subject matter of Example(s) 17 may include that each set of the plurality of sets of TDC measurement component quantization levels has a distinct TDC measurement component quantization level grid.

In Example 23, the subject matter of Example(s) 17 may include that each quantization level in the combined series of quantization levels has a unique entry corresponding to a TDC measurement component quantization level of the plurality of sets of TDC measurement component quantization levels.

In Example 24, the subject matter of Example(s) 17 may include that the combined series of quantization levels is generated by summing simultaneously occurring levels of each of the plurality of sets of TDC measurement component quantization levels together.

Example 25 is a method for a time to digital converter (TDC) circuit to produce an output, the method including: receiving a reference clock (REF) signal and a signal derived from a local oscillator (LO); generating a plurality of digital values indicative of a phase difference between the signal derived from the LO and the REF signal within an REF cycle, where each of the plurality of digital values are determined from a separate series of TDC quantization levels; generating a combined series of quantization levels based on a combination of the separate series of TDC quantization levels; and determining a combined digital value from the combined series of TDC quantization levels and at least one of the plurality of digital values to generate the output.

In Example 26, the subject matter of Example 25 may include the features of Examples 17-24.

Example 27 is a device with means to implement any one of Examples 17-26.

While the above descriptions and connected figures may depict device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A time to digital converter (TDC) circuit configured to:
receive a reference clock (REF) signal and a signal derived from a local oscillator (LO);
generate a plurality of digital values based on one or more TDC measurements by a single TDC measurement component, wherein the plurality of digital values are indicative of a measured phase difference between the signal derived from the LO and the REF signal, wherein each of the plurality of digital values are determined by one of a plurality of sets of TDC measurement component quantization levels;
generate a combined series of quantization levels, wherein each quantization level of the combined series of quantization levels is a sum of simultaneously-in-time occurring ones of the plurality of sets of TDC measurement component quantization levels; and
determine a combined digital value from the combined series of quantization levels and at least one of the plurality of digital values to generate an output of the TDC circuit.

2. The TDC circuit of claim 1, wherein each of the plurality of digital values are based on a time interval between a common event in the signal derived from the LO and the REF signal.

3. The TDC circuit of claim 2, wherein the common event is a rising edge in the signal derived from the LO and the REF signal or a falling edge in the signal derived from the LO and the REF signal.

4. The TDC circuit of claim 1, wherein each set of the plurality of sets of TDC measurement component quantization levels has a distinct TDC measurement component quantization level grid.

5. The TDC circuit of claim 1, wherein each quantization level in the combined series of quantization levels has a unique entry corresponding to a TDC measurement component quantization level of the plurality of sets of TDC measurement component quantization levels.

6. A time to digital converter (TDC) circuit configured to:
receive a reference clock (REF) signal and a signal derived from a local oscillator (LO);
generate a plurality of digital values based on one or more TDC measurements by a single TDC measurement component configured, wherein the plurality of digital values are indicative of a phase difference between the signal derived from the LO and the REF signal within a single REF cycle, wherein each of the plurality of digital values are determined from a separate series of TDC quantization levels;
generate a combined series of quantization levels, wherein each quantization level of the combined series of quantization levels is a sum of simultaneously-in-time occurring ones of the separate series of TDC quantization levels; and
determine a combined digital value from the combined series of TDC quantization levels and at least one of the plurality of digital values to generate an output of the TDC circuit.

7. A method for a time to digital converter (TDC) circuit to produce an output, the method comprising:
receiving a reference clock (REF) signal and a signal derived from a local oscillator (LO);
generating a plurality of digital values based on one or more TDC measurements by a single TDC measurement component configured, wherein the plurality of digital values are indicative of a measured phase difference between the signal derived from the LO and the REF signal, wherein each of the plurality of digital values are determined from a unique set of a plurality of sets of TDC measurement component quantization levels;
generating a combined series of quantization levels based on a combination of the plurality of sets of TDC measurement component quantization levels; and
determining a combined digital value from the combined series of quantization levels and at least one of the plurality of digital values to generate the output of the TDC circuit.

8. The method of claim 7, wherein each of the plurality of digital values are based on a time interval between a common event in the signal derived from the LO and the REF signal.

9. The method of claim 8, wherein the common event is a rising edge in the signal derived from the LO and the REF signal or a falling edge in the signal derived from the LO and the REF signal.

10. The method of claim 7, wherein each set of the plurality of sets of TDC measurement component quantization levels has a distinct TDC measurement component quantization level grid.

11. The method of claim 7, wherein each quantization level in the combined series of quantization levels has a unique entry corresponding to a TDC measurement component quantization level of the plurality of sets of TDC measurement component quantization levels.

* * * * *